United States Patent
Lin et al.

(10) Patent No.: US 7,626,450 B2
(45) Date of Patent: Dec. 1, 2009

(54) METHOD FOR TUNING A TUNABLE FILTER

(75) Inventors: Heng-Chih Lin, Hsinchu (TW);
Fucheng Wang, San Jose, CA (US)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 28 days.

(21) Appl. No.: 11/740,862

(22) Filed: Apr. 26, 2007

(65) Prior Publication Data
US 2008/0164939 A1    Jul. 10, 2008

(30) Foreign Application Priority Data
Jan. 4, 2007    (TW) .............................. 96100286 A

(51) Int. Cl.
*H03K 5/00* (2006.01)

(52) U.S. Cl. ..................................................... 327/553

(58) Field of Classification Search ....................... None
See application file for complete search history.

(56) References Cited

U.S. PATENT DOCUMENTS

| | | | | |
|---|---|---|---|---|
| 6,954,115 B2 * | 10/2005 | Wong | .......................... | 333/17.1 |
| 7,057,451 B2 * | 6/2006 | Lou et al. | ..................... | 327/553 |
| 7,239,196 B2 * | 7/2007 | Hasegawa | .................... | 327/552 |

\* cited by examiner

*Primary Examiner*—Lincoln Donovan
*Assistant Examiner*—Terry L Englund
(74) *Attorney, Agent, or Firm*—Winston Hsu

(57) ABSTRACT

A method for tuning a tunable filter includes inputting a control signal to the tunable filter and tuning the configuration of the tunable filter according to the control signal. When the control signal is at any one of a plurality of predetermined states, a step size of a characteristic frequency of the tunable filter is positively correlated with the characteristic frequency of the tunable filter.

4 Claims, 3 Drawing Sheets

METHOD FOR TUNING A TUNABLE FILTER

BACKGROUND OF THE INVENTION

1. Field of the Invention

The present invention relates to a tunable filter, and more particularly, to a method for tuning the tunable filter.

2. Description of the Prior Art

A tunable filter is a filter capable of having its frequency response tuned, and is widely used in various electronic devices because it provides a flexible filtering range.

Generally speaking, the frequency response of the tunable filter is decided by the status of its control signal. As the status of the control signal changes, the characteristic frequency of the tunable filter changes accordingly. The above-mentioned characteristic frequency is the corner frequency of the tunable low-pass (or high-pass) filter or the pass-band frequency of the tunable band-pass filter.

In many well-known tunable filters, the characteristic frequencies under various configurations are equally distributed within a probable frequency range. For example, FIG. 1 is a distribution diagram of the characteristic frequencies under various configurations of a prior art tunable low-pass filter. In this example, the corner frequency of the tunable low-pass filter is regarded as the characteristic frequency thereof, and the probable frequency range of the corner frequency is 4 MHz-40 MHz. As shown in FIG. 1, the characteristic frequencies under various configurations of the tunable low-pass filter are distributed in increments from 4 MHz to 40 MHz, with the distance between every adjacent characteristic frequency being 1 MHz.

However, the prior art method for distributing the characteristic frequencies in equal increments within the probable frequency range of the tunable filter has some drawbacks. For example, the control of the tunable filter becomes more complex, and at lower characteristic frequencies, the ratio between the step size of the characteristic frequency and the characteristic frequency of the tunable filter is too large, which worsens the signal-to-noise ratio (SNR) of the tunable filter.

Taking the characteristic frequency distribution diagram shown in FIG. 1 for example, because the characteristic frequencies under various configurations of the tunable low-pass filter are equally distributed from 4 MHz to 40 MHz, in which results in 37 probable characteristic frequencies, the control signal of the tunable low-pass filter requires at least 6 bits (i.e., the control signal has to be a 6-bit signal), and this increases the control complexity of the low-pass filter of the system. Additionally, when the characteristic frequency is equal to 4 MHZ, the next adjacent characteristic frequency is 5 MHz. The step size of the characteristic frequency of the tunable low-pass filter is 1 MHz, and the ratio between the step size and the characteristic frequency is 1 MHz/4 MHz=25%. If the data components of the input signal of the tunable low-pass filter are distributed from 0 MHz-4.1 MHz, it is necessary to tune the tunable low-pass filter to the status 02 in FIG. 1. That is, the corner frequency of the tunable low-pass filter has to be controlled at 5 MHz. However, it cannot filter out the noise in the input signal distributed from 4.1 MHz-5 MHz, which greatly degrades the signal-to-noise ratio of the tunable low-pass filter.

SUMMARY OF THE INVENTION

It is therefore an objective of the claimed invention to provide a method for tuning a tunable filter to solve the above-mentioned problems.

According to one embodiment of the claimed invention, a method for tuning the tunable filter is disclosed. The method comprises: inputting a control signal to the tunable filter; and tuning a configuration of the tunable filter according to the control signal. The control signal is at any one of a plurality of predetermined states, a step size of a characteristic frequency of the tunable filter is positively correlated with a characteristic frequency of the tunable filter.

According to another embodiment of the claimed invention, a method for tuning the tunable filter is disclosed. The method comprises: inputting a control signal to the tunable filter; and tuning a configuration of the tunable filter according to the control signal. The control signal tunes the tunable filter to one of a plurality of configurations, and the step size, between any two adjacent characteristic frequencies of characteristic frequencies respectively corresponding to the plurality of configurations of the tunable filter, is positively correlated with the corresponding characteristic frequency.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
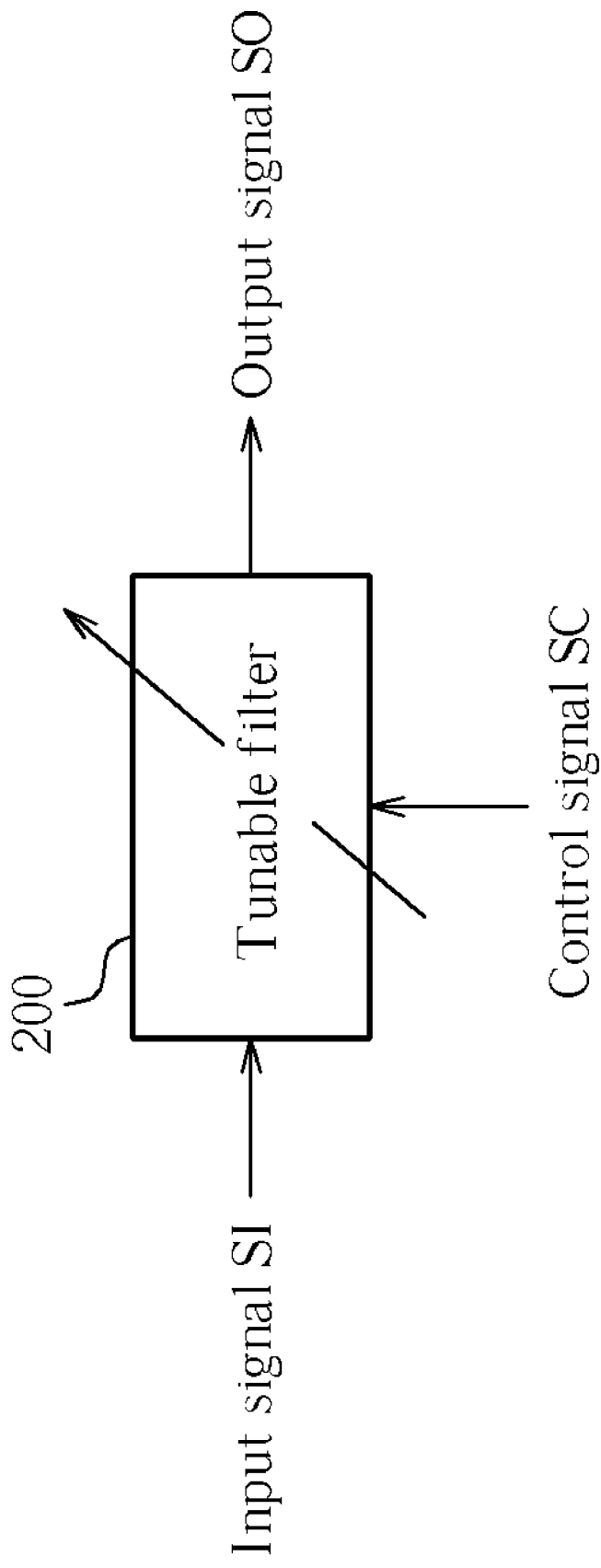
FIG. 2 is a diagram illustrating an embodiment of a tunable filter utilizing a tuning method of the present invention.

FIG. 2 is a diagram illustrating a tunable filter utilizing an embodiment of the tuning method of the present invention. In this embodiment, the tunable filter 200 is a tunable low-pass filter which is used for low-pass filtering an input signal SI to generate an output signal SO, where the frequency response of the tunable filter 200 is determined by the status of a control signal SC.

The control signal is used to control the configuration of the tunable filter 200. For example, if the tunable filter 200 is an active RC filter, the control signal SC serves as a basis for one of the following three tuning methods: discretely switching the resistors of the tunable filter 200; discretely switching the capacitors of the tunable filter 200; and discretely switching the resistors and capacitors of the tunable filter 200. According to any one of the above-mentioned tuning methods, the control signal SC can tune the frequency response of the tunable filter 200, that is, the characteristic frequency CF (i.e., the corner frequency) of the tunable filter 200 can be determined by the control signal SC.

Figure 3:
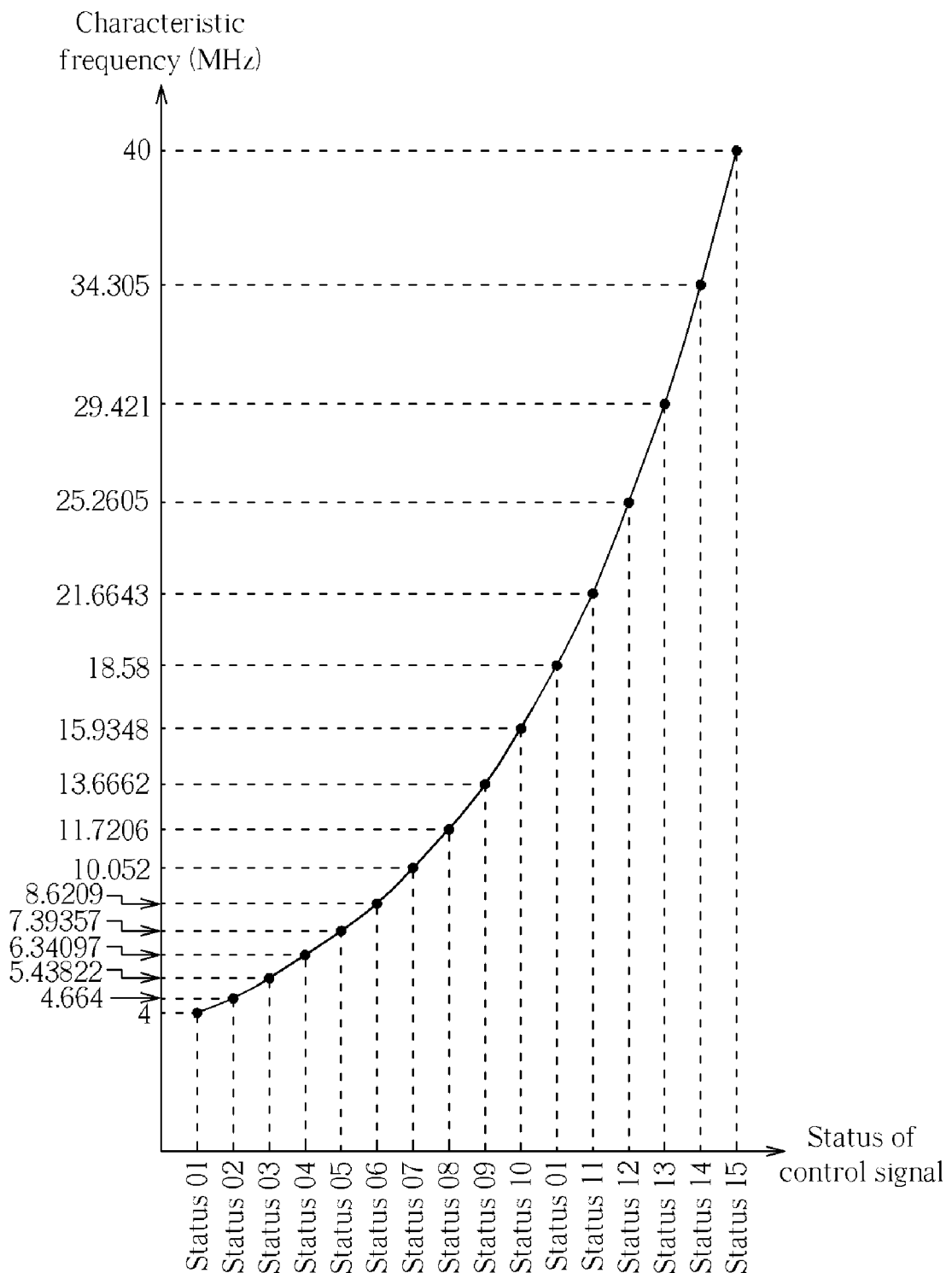
FIG. 3 is a diagram illustrating the relationship between characteristic frequencies of the tunable filter and status of the control signal in FIG. 2.

In this embodiment, the control signal SC is capable of being set at any one of a plurality of predetermined states. When the control signal SC is at any one of the predetermined states, the step size SS of the characteristic frequency CF of the tunable filter 200 is positively correlated with the characteristic frequency of the tunable filter 200. FIG. 3 illustrates the relationship between the characteristic frequency CF of the tunable filter 200 and the status of the control signal SC. In this example, the probable frequency range of the characteristic frequency is 4 MHz-40 MHz, but the intermittent distance between each adjacent characteristic frequency is not equal to each other, that is, the distances between adjacent characteristic frequencies can differ.

In this embodiment, the greater the characteristic frequency CF, the greater the step size SS becomes. This feature is adopted for tuning the tunable filter 200. In FIG. 3, the step size SS is positively proportional to the characteristic frequency CF. More specifically, in this exemplary case, the step size SS is 0.166 times that of the characteristic frequency CF. For example, when the control signal SC is at the predetermined status 01, the characteristic frequency CF is equal to 4 MHz; and the characteristic frequency CF of the next stage is 4.664 MHz, where the corresponding step size SS is equal to 0.664 MHz, that is, the step size SS is 0.166 times that of the characteristic frequency CF. When the control signal SC is at the predetermined status 02, the characteristic frequency CF is equal to 4.664 MHz; and the characteristic frequency CF of the next stage is 5.438 MHz, where the step size SS is equal to 0.774 MHz, that is, the step size is 0.166 times that of the characteristic frequency CF. When the control signal SC is at the predetermined status 13, the characteristic frequency CF is equal to 29.421 MHz, and the characteristic frequency CF of the next stage is 34.305 MHz, where the step size SS is equal to 4.884 MHz, that is, the step size is 0.166 times that of the characteristic frequency CF. When the control signal SC is at the predetermined status 14, the characteristic frequency CF is equal to 34.305 MHz, and the characteristic frequency CF of the next stage is 40 MHz, where the step size SS is equal to 5.695 MHz, that is, the step size is 0.166 times that of the characteristic frequency CF.

According to the above-mentioned tuning method, the characteristic frequency CF of the tunable filter 200 is determined according to an exponential function of the predetermined status of the control signal SC. In other words, the relationship between the characteristic frequency CF and the predetermined status n of the control signal SC is shown through (1) below:

$$CF(n)=CF_0 * k^{(n-1)} \qquad (1)$$

where n is a positive integer between 1 and 16.

In the above example, $CF_0=4$ MHz, and $k=10^{1/15} \cong 1.166$; that is, when the control signal SC is at the predetermined status 01, the characteristic frequency CF is equal to 4 MHz*$1.166^0$=4 MHz. When the control signal SC is at the predetermined status 02, the characteristic frequency CF is equal to 4 MHz*$1.166^{2-1}$=4.664 MHz. When the control signal SC is at the predetermined status 16, the characteristic frequency CF is equal to 4 MHz*$1.166^{16-1}$=40 MHz.

Figure 1:
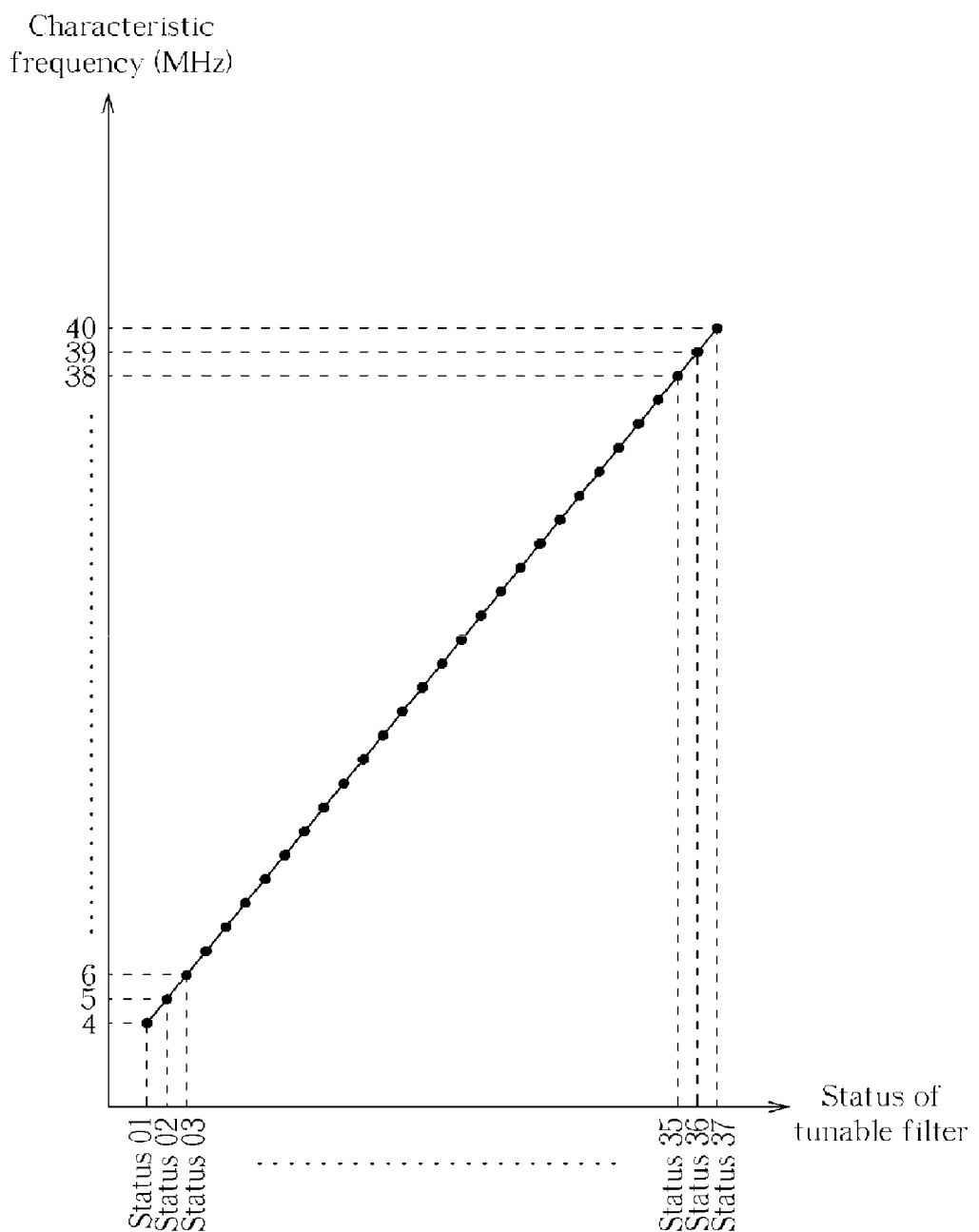
FIG. 1 is a distribution diagram illustrating characteristic frequencies under different configurations for a tunable low-pass filter.

According to the above-mentioned tuning method of the present invention, the control complexity of the tunable filter 200 is reduced compared to the prior art, and at the lower characteristic frequency, the signal-to-noise ratio of the tunable filter 200 is improved. In FIG. 3, because the tunable filter 200 has sixteen probable characteristic frequencies, the control signal SC only needs 4 bits (i.e., the control signal SC is implemented by a 4-bit signal). When compared with the 6-bit control signal in FIG. 1, it is simpler to control the tunable filter 200 according to this embodiment. In addition, when the characteristic frequency is 4 MHz, the next adjacent characteristic frequency is equal to 4.664 MHz, and the step size SS of the characteristic frequency CF of the tunable filter 200 is 0.664 MHz. That is, the ratio of the step size SS and the characteristic frequency CF is 0.664 MHz/4 MHz=16.6%, which is smaller than produced by the prior art method. If the data components of the input signal SI are distributed from 0 MHz-4.1 MHz, to ensure that the data component will not be filtered out, the control signal SC must be set at the predetermined status 02 (i.e., the corner frequency of the tunable filter 200 is 4.664 MHz), and the tunable filter 200 can filter out any noise having frequency above 4.664 MHz. Compared with the above-mentioned prior art method that only filters out the noise having frequency above 5 MHz, the tunable filter 200 of this embodiment indeed provides better signal-to-noise ratio.

Please note that, although the tunable low-pass filter is used as an example of the tunable filter 200, it is not meant to limit the scope of the invention. In additional embodiments, the tunable filter 200 utilizing the method of this invention can also be a tunable high-pass filter, a tunable band-pass filter, or any other type of tunable filters.

Those skilled in the art will readily observe that numerous modifications and alterations of the device and method may be made while retaining the teachings of the invention.

What is claimed is:

1. A method for tuning a tunable filter, comprising:
    inputting a control signal to the tunable filter, wherein the control signal corresponds to one of a plurality of predetermined statuses of the tunable filter; and
    tuning a configuration of the tunable filter according to the control signal;
    wherein the plurality of predetermined statuses correspond one-to-one to a plurality of characteristic frequencies, respectively; and for each of the characteristic frequencies, a ratio between a step size of the characteristic frequency and the characteristic frequency is substantially the same, where the step size of the characteristic frequency is a value between the characteristic frequency and its next adjacent characteristic frequency.

2. The method of claim 1, wherein the characteristic frequency is a corner frequency of the tunable filter.

3. The method of claim 1, wherein the characteristic frequency is a pass-band frequency of the tunable filter.

4. The method of claim 1, wherein the tunable filter is an active RC filter.

* * * * *